(12) United States Patent
Sundelin

(10) Patent No.: US 6,882,683 B2
(45) Date of Patent: Apr. 19, 2005

(54) MONITORING METHOD AND MONITORING ARRANGEMENT

(75) Inventor: Juha Sundelin, Martinniemi (FI)

(73) Assignee: Nokia Corporation, Espoo (FI)

(*) Notice: Subject to any disclaimer, the term of this patent is extended or adjusted under 35 U.S.C. 154(b) by 244 days.

(21) Appl. No.: 09/949,588

(22) Filed: Sep. 10, 2001

(65) Prior Publication Data

US 2002/0126781 A1 Sep. 12, 2002

Related U.S. Application Data

(63) Continuation of application No. PCT/FI00/00189, filed on Mar. 10, 2000.

(30) Foreign Application Priority Data

Mar. 12, 1999 (FI) .................................................. 990554

(51) Int. Cl.$^7$ ........................... H04B 17/00; H04B 3/46; H04Q 1/20
(52) U.S. Cl. ........................................ 375/224; 375/342
(58) Field of Search ................................. 375/224, 316, 375/340, 342, 343, 368, 228, 213; 327/1, 48; 714/715, 738

(56) References Cited

U.S. PATENT DOCUMENTS

| | | | | |
|---|---|---|---|---|
| 3,582,559 A | * | 6/1971 | Hitchcock et al. | ........... 704/253 |
| 4,607,378 A | * | 8/1986 | Catlin et al. | ................. 375/368 |
| 4,920,535 A | | 4/1990 | Watanabe et al. | |
| 5,068,880 A | | 11/1991 | Kline et al. | |
| 5,253,254 A | | 10/1993 | Roberts et al. | |
| 5,400,369 A | | 3/1995 | Ikemura | |
| 5,497,377 A | * | 3/1996 | Muto et al. | .................. 714/715 |
| 5,590,159 A | | 12/1996 | Anderson | |

FOREIGN PATENT DOCUMENTS

| | | |
|---|---|---|
| EP | 0 397 144 | 11/1990 |
| EP | 0 460 604 | 12/1991 |
| EP | 0 659 001 | 6/1995 |

OTHER PUBLICATIONS

Derwent Publication No. 1998–038709 (Derwent Week 199804).*
International Search Report for PCT/FI00/00189.

* cited by examiner

Primary Examiner—Jean B. Corrielus
(74) Attorney, Agent, or Firm—Squire, Sanders & Dempsey LLP

(57) ABSTRACT

The invention relates to a monitoring method and monitoring arrangement, which receives a parallel-mode signal transferred to the arrangement by using a clock signal. The monitoring arrangement comprises a counter counting clock signals, a monitoring means, a control means, a second means and a first means where the parallel-mode signal is transferred by using the clock signal, the signal being converted to seemingly serial mode in the first means which transfers the signal it has converted to serial mode to the first means one bit at a time by using the above mentioned clock signal. The first and second means transfer their seemingly serial-mode output signals to the monitoring means which searches the received signals for a predetermined bit pattern where the control means locks to. On the basis of the number of the clock signals it has counted, the counter defines the signal point to be monitored.

20 Claims, 2 Drawing Sheets

MONITORING METHOD AND MONITORING ARRANGEMENT

This application is a continuation of PCT/FI00/00189, filed on Mar. 10, 2000.

FIELD OF THE INVENTION

The invention relates to a monitoring method where a parallel-mode signal is received and transferred to a monitoring arrangement by using a clock signal.

BACKGROUND OF THE INVENTION

In a prior art monitoring arrangement, a parallel-mode signal entering the arrangement is converted to a serial-mode signal, which is supplied to series-connected registers where the signal is monitored. In the monitoring, the signal can be searched for different bit patterns, for example.

A signal converted to serial mode consists of bit sequences of a predetermined length, i.e. bytes. The prior art arrangement does not allow a parallel-mode signal to be directly monitored if the frame phase of the signal converted from parallel to serial mode does not coincide with byte boundaries. Problems have occurred particularly in situations where the arrangement receives a signal from a parallel bus that has a different phase than the signal the bus is carrying to the arrangement. The problem has been alleviated by buffering of the signal coming to the arrangement. However, the signal must be buffered to a considerable extent, whereby other problems, such as delay, arise due to the buffering.

The prior art arrangement requires a clock signal proportional to the bit rate of the incoming signal, the clock signal being used for transferring the signal to the arrangement. If the average bit rate of the input signal is for example doubled, the frequency of the clock signal used for transferring the input signal must be doubled. Due to the forming of a clock signal proportional to the data rate of the input signal the arrangement is, however, considerably complex.

BRIEF DESCRIPTION OF THE INVENTION

It is therefore an object of the invention to provide a method and an equipment to implement the method which allow the above problems to be solved. This is achieved with a method disclosed in the preamble, which is characterized by transferring a parallel-mode signal one bit at a time, by using a clock signal, to a first storing location where the signal is converted to a seemingly serial-mode signal which is transferred by using said clock signal to a second storing location; searching the serial-mode output signals in the storing locations for a predetermined bit pattern and locking to the pattern; counting the clock signals appearing after the locking; and searching the signal to be monitored, on the basis of the number of the counted clock signals, for the signal point to be monitored.

The invention further relates to a monitoring arrangement which receives a parallel-mode signal that is transferred to the arrangement by using a clock signal.

The arrangement of the invention is characterized in that the monitoring arrangement comprises a counter counting the clock signals, a monitoring means, a control means, a second means and a first means where the parallel-mode signal is transferred to by using the clock signal, the signal being converted to seemingly serial mode in the first means, which transfers the signal it has converted to serial mode to the second means one bit at a time by using the clock signal, the first and second means transferring their seemingly serial mode signals to the monitoring means that searches the signals for a predetermined bit pattern where the control means locks to, and, on the basis of the number of the clock signals it has calculated, the counter defines the signal point to be monitored.

The preferred embodiments of the invention are disclosed in the dependent claims.

The invention is based on converting a signal arriving in parallel mode to at least two seemingly serial-mode signals. The seemingly serial-mode signals are searched for a known bit pattern where the routine locks to. The signals that have been converted to serial mode are clocked at different times from the parallel bus to the arrangement. After the locking, the signal point to be monitored is searched for on the basis of the number of the clock signals that have appeared.

The method and arrangement of the invention provide several advantages. The method allows a monitoring arrangement to be implemented such that a signal arriving to the arrangement need not be clocked by using a clock signal proportional to the bit rate of the input signal. The same monitoring method can therefore be applied to the various bit rates of the input signal. The arrangement is therefore most flexible to use in an operating environment where the bit rate of the input signal changes from time to time.

BRIEF DESCRIPTION OF THE DRAWINGS

In the following the invention will be described in greater detail in connection with preferred embodiments and with reference to the accompanying drawings, in which.

DETAILED DESCRIPTION OF THE INVENTION

Figure 1:
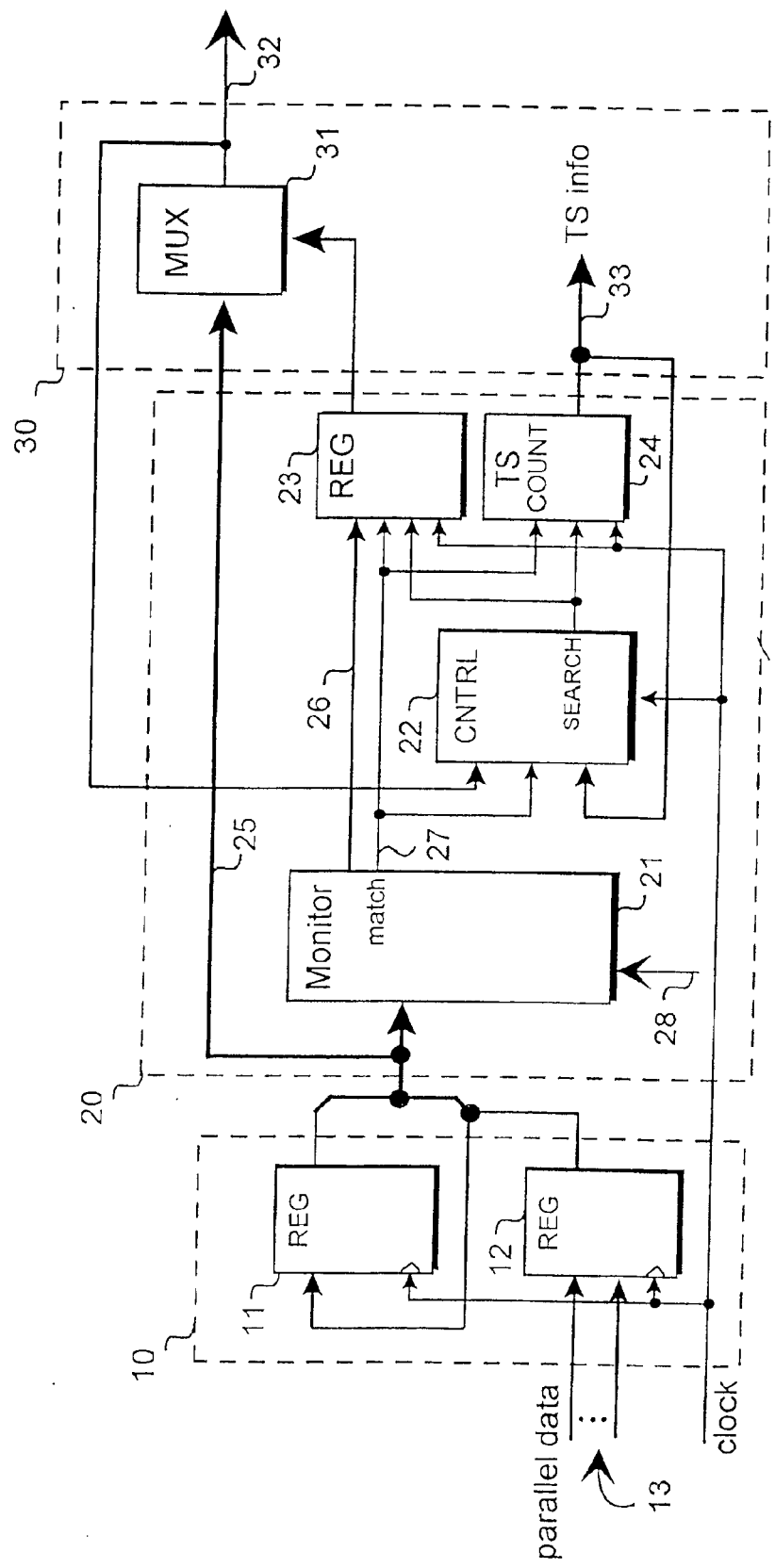
FIG. 1 illustrates a monitoring arrangement of the invention.

The monitoring arrangement shown in FIG. 1 comprises three blocks: a register block 10, a monitoring block 20 and a transfer block 30. The monitoring arrangement can be implemented for example by using an ASIC circuit and software. The register block 10 comprises a first means 11 and a second means 12. The means 11 and 12 are connected in series, the output of the means 12 being connected to the input of means 11. The means 11, 12 serve as temporary storing locations for the bits of a received signal. The means 11, 12 can be implemented for example by means of parallel shift registers. The arrangement shown in the Figure can be used for example for monitoring signals transferred in fixed transmission systems. The monitoring arrangement receives a digital signal from a bus.

The monitoring block 20 comprises a monitoring means 21, a control means 22, a means 23 and a counter 24. The arrangement comprises a bus 25 interconnecting the register block 10 and the monitoring block 20. The output of the means 12 is connected to the output of the means 11 such that the signals received from the outputs proceed in parallel to the monitoring means. The seemingly serial-mode signals proceeding in parallel are clocked to the arrangement from a parallel bus 13 at different times. From the point of view of the blocks 20 and 30, the seemingly serial-mode signals look as if they were in serial mode, although in practice the signals can be transferred to the blocks 20, 30 in serial or parallel mode. The bus 25 is also connected to the transfer block 30. The bus 25 is used for transferring parallel-mode words, the length of the words depending on the width of the data signal to be monitored. Word length can be for example 8 bits. The monitoring means 21 connects to the means 23 by using an enable signal 26 it has generated. The monitoring means generates a match signal 27 which is connected to the control means 22, the means 23 and the counter 24.

The search output of the control means 22 is connected to the means 23 and the counter 24 which serves as a time slot counter. The output of the counter provides a signal which comprises data of the time slot to be monitored and which is feedback coupled to the control means. The control means can be implemented for example by a state machine that can lock to a signal frame alignment word, for example, or to another predetermined bit pattern denoting signal point.

The transfer block 30 comprises means 31 that channels signals. The means 31 can be implemented for example with a mux circuit. The bus 25 and the output of the means 23 are coupled to the means 31. The output of the means 12 is coupled to the output of the means 11 such that the signals received from the outputs of the means 11, 12 proceed in parallel to the means 31. The means 31 generates an output signal of the signals it has received, the output signal being conveyed to the control means 22.

The arrangement uses a clock signal that may be gapped. A gapped clock signal means that the data to be clocked with the clock signal does not arrive steadily, but the clock signal may comprise bursts, for example. A gapped clock signal entering the means 11, 12 can be generated for example by supplying a non-gapped clock signal and an enable signal to an AND port the output of which provides a gapped clock signal for the means 11, 12.

At the input side of the means 12, the register block 10 is connected to the parallel bus 13. The Figure shows that both the means 11, 12 are connected to the same clock signal. The above mentioned clock signal is also used for clocking the control means 22, the means 23 and the counter 24. The means 12 receives from the parallel bus a signal which is in parallel mode and which is clocked to the means 12 by means of the clock signal.

In the following, the operation of the monitoring arrangement is described in greater detail. As stated above, the means 12 in the register block receives from the bus 13 a signal which is in parallel mode. The signal entering the arrangement in parallel mode is divided into bytes. However, the phase of the data within a byte may be unknown. The aim is to also find those signals that are not within the byte boundaries from the signal to be monitored. In the arrangement according to the Figure, bytes are clocked from the bus 13 to the arrangement such that two clocked bytes appear one after the other in the register block 10. This means that a first byte is clocked to the means 12 from where the byte is transferred to the means 11. During the transfer of this byte, a new byte is clocked to the means 12. The register block thus always contains data relating to at least two different bytes. In practice the register block converts the parallel-mode signal coming from the bus 13 to a mode where the signals coming from the register block 10 are seemingly serial mode from the point of view of the monitoring means 21.

Figure 2:
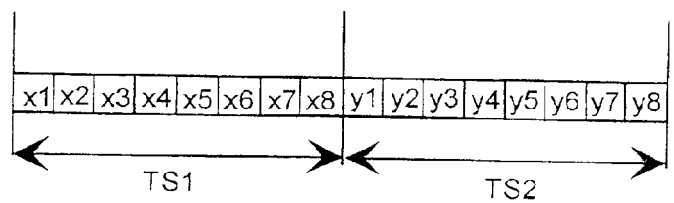
FIG. 2 illustrates data that is within byte boundaries.

FIG. 2 shows data that is within the byte boundaries. The Figure illustrates a byte consisting of data bits x1–x8 that fills up a time slot TS1 which forms the byte boundaries. As we can see in the Figure, bit x1 is the first bit and bit x8 the last bit in the time slot. In other words, the data is within the byte boundaries.

Figure 3:
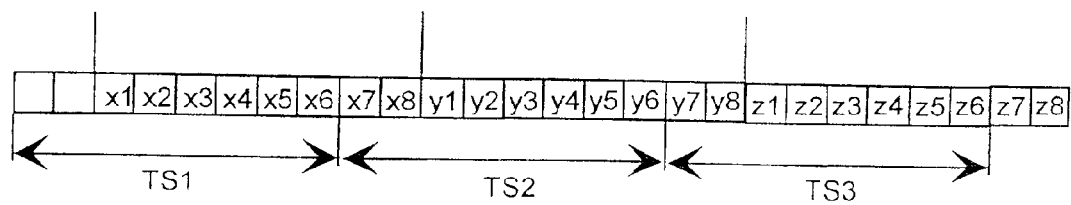
FIG. 3 illustrates data that is outside byte boundaries.

If a byte consists of for example data bits y1–y8 located in more than one time slot, the data is not within the byte boundaries. This situation is illustrated in FIG. 3 where time slots TS2 and TS3 divide the byte consisting of the data bits y1–y8.

The means 11, 12 in the register block form a register stage that has a predetermined width which determines the number of bits simultaneously located in the register stage. Bytes are clocked to both means 11, 12 one bit at a time, a byte coming from the bus being first clocked to the means 12 from where the bits are further shifted one bit at a time to the means 11. The bits that were first transferred to the means 12 do not continue to the means 11 until the means 12 is loaded full of bits. The width of the register degree implemented with the means 11, 12 depends on the width of the bus 13 to be monitored. The length of the register degree also depends on the length of the bit pattern to be searched for. The number of the registers used in the arrangement depends on the implementation.

The total length of the register degree in the register block is at least two bits. In practice, the width of the means 12 must correspond at least to the width of the means 13. The width of the means 11 depends on the length of the bit pattern to be searched for. If the arrangement is used for finding for example a frame alignment word of seven bits, and the arrangement employs eight bit long bytes, the means 12 must be at least eight bits long. Consequently, the means 11 must be at least seven bits long. It may be said that the length of the means 12 that serves as the register depends on the width of the bus 13 that carries the data to be monitored to the arrangement and that the length of the means 11 serving as the register depends on the length of the bit pattern searched for. If, on the other hand, the length of the bit pattern is for example 16 bits and the width of the bus 13 is only eight bits, then at least four of eight-bit registers must be placed in the register block.

The monitoring system of the invention can be examined by applying the length of the bit pattern to be searched for and the width of the bus 13 to be monitored in the following way. If the length of the bit pattern to be searched for equals the width of the bus 13, the registers are equally long. If the length of the bit pattern to be searched for is smaller than the width of the bus 13, two register degrees are needed, the latter of which may have a length that can be smaller than the length of the first register degree. In the arrangement of FIG. 1, the means 12 forms the first register. The means 11 forms the second register. If the length of the bit pattern to be searched for is greater than the width of the bus 13, the combined minimum total length of the registers can be obtained by multiplying the length of the bit pattern to be searched for by two and by subtracting one from the product.

The bits obtained from the output of the means 11 and those obtained from the output of the means 12 are transferred to the monitoring means 21 and the means 31 over the bus 25. The monitoring means 21 also receives a signal 28 which comprises the bit pattern to be searched for or information about the bit pattern to be searched for. When the bit pattern to be searched for is found in the signal to be monitored, the system locks to the bit pattern. When the signal that has arrived to the monitoring means over the bus 25 contains the bit pattern included in the signal 28, the monitoring means generates a match signal 27 which is conveyed to the control means 22, the means 23 and the counter 24. When searching for the bit pattern, the monitoring means compares the signal 28 with the one coming over the bus 25. The comparison can be carried out for example by applying a logic generated by means of VHDL description language. Furthermore, the bit pattern must be at least two bits long.

When the match signal is activated, it is stored in the means 23 which uses a signal generated with the match signal to control the means 31 in the transfer block 30. When the bit pattern to be searched for has been found, the monitoring of the desired the signal point can start.

The counter 24 keeps record of the signal point to be monitored. The counter can also keep record of for example the time slots to be monitored. For example, information about the time slot to be monitored can be supplied to the counter in advance. When the counter 24 finds a locking point, it activates a match signal the location of which in the signal is known in advance. After the locking, the counter counts a necessary number of clock signals, which allows the signal point to monitored to be found.

Let us assume that the arrangement is aligned with a predetermined bit pattern, after which the arrangement is ready to monitor time slot eight, for example. The counter generates a signal that allows time slot eight to be identified from the signal to be monitored. When the state machine has found the signal point, the means 31 selects on the basis of the enable signal 26 generated by the monitoring means 21 the bits in time slot eight for monitoring which can then be transferred in the signal 32 to a RAM circuit or register, for example, for any further measures.

Although the invention is described above with reference to an example shown in the attached drawings, it is apparent that the invention is not restricted to it, but can vary in many ways within the inventive idea.

What is claimed is:

1. A monitoring method where a parallel-mode signal is received and transferred to a monitoring arrangement by using a clock signal, the method comprising:

transferring the parallel-mode signal one bit at a time, by using the clock signal, to a first storing location where the parallel-mode signal is converted to a seemingly serial-mode signal which is transferred by using said clock signal to a second storing location;

searching seemingly serial-mode output signals output by the first and second storing locations respectively for a predetermined bit pattern and locking to the pattern;

counting the clock signals appearing after the locking; and searching a signal on the basis of the number of the counted clock signals, for a signal point to be monitored.

2. A method according to claim 1, wherein the parallel-mode signal is transferred to the first storing location by using a clock signal which is not dependent on a data rate of the received parallel-mode signal.

3. A method according to claim 1, wherein the method is used for monitoring a signal composed of bytes where a frame phase does not coincide with the byte boundaries.

4. A method according to claim 1, wherein the predetermined bit pattern is searched for by comparing the bit pattern searched for with signals obtained from the outputs of the storing locations.

5. A method according to claim 1, wherein alignment with the predetermined bit pattern generates a signal which is used to activate the search for the signal point to be monitored.

6. A method according to claim 1, wherein at least two parallel-mode signals are searched for a predetermined bit pattern.

7. A method according to claim 1, wherein at least two parallel serial-mode signals composed of bytes which are shifted forward one bit at a time are searched for a predetermined bit pattern.

8. A method according to claim 1, wherein on the basis of the alignment with a bit pattern, a time slot is searched for in a signal comprising time slots, and the time slot is monitored.

9. A method according to claim 1, wherein the predetermined bit pattern is a frame alignment word, the location of which in the signal is known in advance.

10. A method according to claim 1, wherein the storing locations are registers.

11. A monitoring arrangement which receives a parallel-mode signal that is transferred to the arrangement by using a clock signal, wherein:

the monitoring arrangement comprises a counter counting the clock signal, a monitoring means, a control means, a second means and a first means where the parallel-mode signal is transferred to by using the clock signal, the parallel-mode signal being converted to seemingly serial mode in the first means, which transfers the signal converted to seemingly serial mode to the second means one bit at a time by using the clock signal;

the first and second means transferring their seemingly serial-mode signals to the monitoring means that searches the seemingly serial-mode signals for a predetermined bit pattern where the control means locks to; and on the basis of the number of the clock signals it has counted, the counter defines a signal point to be monitored.

12. An arrangement according to claim 11, wherein the signal is transferred to the monitoring means by using a clock signal which is not dependent on the data rate of the received parallel-mode signal.

13. An arrangement according to claim 11, wherein the arrangement monitors a signal that comprises bytes, a frame phase of the signal being outside byte boundaries.

14. An arrangement according to claim 11, wherein the monitoring means searches for the predetermined bit pattern by comparing the bit pattern to be searched for with the output signals of the first and second means.

15. An arrangement according to claim 11, wherein the monitoring means searches for the point to be monitored on the basis of the clock signals that are counted after alignment with the bit pattern has taken place.

16. An arrangement according to claim 11, wherein when alignment with the predetermined bit pattern takes place, the monitoring means generates a signal that activates the search for the signal point to be monitored.

17. An arrangement according to claim 11, wherein the monitoring means searches for the predetermined bit pattern at least from a first serial-mode signal and a second serial-mode signal composed of bytes that are shifted forward one bit at a time.

18. An arrangement according to claim 11, wherein on the basis of an alignment point, the monitoring means searches for a time slot that is monitored in a signal comprising time slots.

19. An arrangement according to claim 11, wherein the predetermined bit pattern is a frame alignment word, the location of which in the signal is known in advance.

20. An arrangement according to claim 11, wherein the first and second means are registers.

* * * * *